United States Patent
Kang et al.

(10) Patent No.: US 7,723,191 B2
(45) Date of Patent: May 25, 2010

(54) METHOD OF MANUFACTURING SEMICONDUCTOR DEVICE HAVING BURIED GATE

(75) Inventors: Eun-young Kang, Seoul (KR); Jun Seo, Suwon-si (KR); Jae-seung Hwang, Suwon-si (KR); Sung-il Cho, Seoul (KR); Yong-hyun Kwon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/000,496

(22) Filed: Dec. 13, 2007

(65) Prior Publication Data

US 2008/0146002 A1 Jun. 19, 2008

(30) Foreign Application Priority Data

Dec. 14, 2006 (KR) ...................... 10-2006-0127954

(51) Int. Cl.
*H01L 21/336* (2006.01)
(52) U.S. Cl. ...................... 438/272; 438/430; 438/589; 438/739; 257/E21.429
(58) Field of Classification Search ................. 438/589
See application file for complete search history.

(56) References Cited

U.S. PATENT DOCUMENTS 6,656,764 B1* 12/2003 Wang et al. ................. 438/104

2005/0136616 A1* 6/2005 Cho et al. ................... 438/425
2006/0157079 A1* 7/2006 Kim et al. ................... 134/1.1
2008/0113515 A1* 5/2008 Kim et al. ................... 438/702

FOREIGN PATENT DOCUMENTS

| JP | 2006-013017 | 1/2006 |
| KR | 1998-085035 | 12/1998 |
| KR | 1020040079518 | 9/2004 |
| KR | 1020050043408 | 5/2005 |
| KR | 1020050059488 | 6/2005 |
| KR | 1020050062019 | 6/2005 |

OTHER PUBLICATIONS

Korean Office Action issued Oct. 22, 2007.

* cited by examiner

*Primary Examiner*—Stephen W Smoot
(74) *Attorney, Agent, or Firm*—Harness, Dickey & Pierce, P.L.C.

(57) ABSTRACT

A method of manufacturing a semiconductor device having buried gates may include forming a stacked structure of sequentially stacked first mask patterns and second mask patterns with equal widths to expose active regions and isolation regions of a semiconductor substrate. After forming reduced first mask patterns by decreasing the width only of the first mask patterns, trenches may be formed in the active regions and the isolation regions by etching the exposed portions of the semiconductor substrate using the second mask patterns as an etch mask. Then, gate insulating films may be formed on inner walls of the trenches in the active regions, and a conductive material may be buried into the trenches in the active regions and the isolation regions to form gates.

20 Claims, 13 Drawing Sheets

METHOD OF MANUFACTURING SEMICONDUCTOR DEVICE HAVING BURIED GATE

PRIORITY STATEMENT

This application claims the benefit of Korean Patent Application No. 10-2006-0127954, filed on Dec. 14, 2006, in the Korean Intellectual Property Office, the disclosure of which is incorporated herein in its entirety by reference.

BACKGROUND

1. Field

Example embodiments relate to a method of manufacturing a semiconductor device, for example, to a method of manufacturing a semiconductor device having a buried gate.

2. Description of the Related Art

Memory cells may be reduced or minimized as the integration density of semiconductor devices increases. Accordingly, continuing efforts are being made to obtain a desired or predetermined cell capacitance in a reduced or minimized memory cell and improve cell transistor characteristics. As such, reduced or minimized memory cells may further require smaller cell transistors. In response to such reduction or minimization, various methods of controlling an impurity density in a diffusion layer of cell transistors have been suggested to embody cell transistors that do no have any problems in terms of cell transistor characteristics. However, as a channel length of cell transistors is decreased, various thermal treatments performed when manufacturing semiconductor devices make the control of the depth of a diffusion layer of a transistor more difficult, so that an effective channel length as well as a threshold voltage decrease and may result in short channel effects and thereby, cause problems in operating the cell transistor.

As a method of solving the above-mentioned problems, a buried-gate type transistor has been suggested, in which a trench is formed in a surface of a substrate, and a gate of the buried-gate type transistor is formed within the trench. In the buried-gate type transistor, the gate is formed within the trench to lengthen a distance between a source and a drain. Therefore, an effective channel length may be increased, and thus, short channel effects may be decreased.

Conventionally, in order to fabricate the buried-gate type transistor, an isolation region that defines an active region may be formed in a semiconductor substrate. Then, trenches may be formed in the active region and the isolation region of the semiconductor substrate to form gate electrodes in the trenches. However, as the width of the gate electrode is decreased to embody a higher integrated memory cell, the width of the trench to be formed in the semiconductor device decreases. If a trench with a narrow width as above is formed, an internal width of the trench formed in the isolation region may be slightly greater than an internal width of the trench formed in the active region even when trenches of the same dimension are each formed in the active region and the isolation region as will be described in more detail. Hence, before burying a gate material into the trench, a natural oxide film within the trench may be removed using a conventional etchant. In this case, the materials each constituting the active regions and the isolation regions have different etch rates with respect to the etchant used for removing the natural oxide film. Conventionally, the isolation region that is composed of an oxide film may be slightly consumed by the conventional etchant that removes the natural oxide film. As the result, the internal width of the trench formed in the isolation region is greater than that of the trench formed in the active region. For example, when a polysilicon mask is used as an etch mask for forming the trench, a sidewall of the polysilicon mask may be oxidized as much as a desired or predetermined thickness when forming a gate oxide film within the trench. Therefore, an entrance width of the trench may be less than the internal width of the trench in the isolation region, so that voids may be formed within the trench in the isolation region when performing deposition for burying the gate material within the trench.

If the gate oxide film is grown along the surfaces of the voids once the voids are formed within the trench as above, the gate material buried within the trench may not be recessed as desired because the oxide films formed on the surfaces of the voids may act as an etch mask when etching-back the gate material buried within the trench for forming the buried gate.

In order to overcome the above-described problems, cleaning may be performed after etching-back the gate material buried within the trench. However, if a cleansing solution permeates into the voids, a problem of isotropic etching may occur to adversely increase a removal quantity of the gate material buried within the trench to be more than an intended quantity. In order to form a buried gate having more uniform electrical characteristics for each cell, it may be important to identically control the recess quantity of the gate material buried into the trench. Excessive recess of the gate material within the trench may result in a line break and an increased resistance of the gate. Also, a recess that is less than a desired quantity may cause a short circuit between a buried gate and a direct contact (DC) adjacent to the buried gate. Therefore, the above-mentioned factors may negatively affect the reliability of an obtained transistor.

SUMMARY

Example embodiments provide a method of manufacturing a semiconductor device in order to fabricate a reliable transistor by more uniformly burying a gate material into a trench to reduce or prevent defects such as voids from occurring in the trench when a buried gate at a fine dimension is formed and thus, embody a more highly integrated semiconductor device.

According to example embodiments, there is provided a method of manufacturing a semiconductor device that may include forming a stacked structure of sequentially stacked first mask patterns and second mask patterns with equal widths to respectively expose active regions and isolation regions of a semiconductor substrate, forming reduced first mask patterns by decreasing the width of the first mask patterns (for example, only the first mask patterns and not the second mask patterns), forming trenches in the active regions and the isolation regions by etching the exposed portions of the semiconductor substrate using the second mask patterns as an etch mask, forming gate insulating films on inner walls of the trenches in the active regions, and/or burying a conductive material into the trenches in the active regions and the isolation regions to form gates.

After forming the trenches and before forming the gate insulating films, removing natural oxide films formed along the inner walls of the trenches in the active regions and the isolation regions may be further included.

Forming the reduced first mask patterns may include etching a predetermined or desired width of the sidewalls of the first mask patterns using isotropic chemical dry etching (CDE). Otherwise, forming the reduced first mask patterns may include etching a predetermined or desired width of the sidewalls of the first mask patterns using wet etching.

Also, forming the reduced first mask patterns may include oxidizing a predetermined or desired width of the sidewalls of the first mask patterns to form sidewall oxide films along the sidewalls of the first mask patterns. In example embodiments, after forming the sidewall oxide films and before forming the trenches, removing the sidewall oxide films may be further included. Alternatively, after forming the trenches and before forming the gate insulating film, removing the sidewall oxide films may be further included.

Forming the gates may include completely burying the conductive material into the trenches, and partially removing the conductive material buried within the trenches from entrances of the trenches to form buried gates which partially fill in the trenches from bottoms of the trenches.

According to example embodiments, forming the stacked structure of the first mask patterns and the second mask patterns may include forming a first mask layer on the active regions and the isolation regions of the semiconductor substrate, forming a second mask layer on the first mask layer, and/or patterning the first mask layer and the second mask layer using photolithography to form the stacked structure of the first mask patterns and the second mask patterns.

According to example embodiments, forming the stacked structure of the first mask patterns and the second mask patterns may include forming a first mask layer on the active regions and the isolation regions of the semiconductor substrate, forming a second mask layer on the first mask layer, patterning the second mask layer using photolithography to form first portions of the second mask patterns formed of a plurality of first patterns repeated at a predetermined pitch, forming a sacrificial film covering the first patterns and the first mask layer, forming second portions of the second mask patterns formed of a plurality of second patterns each being filled in spaces between adjacent patterns out of the first patterns on the sacrificial film, and/or etching the sacrificial film and underlying the first mask layer exposed between the first patterns and the second patterns.

The first patterns and the plurality of second patterns may be composed of the same material. The first mask layer and the sacrificial film may be composed of the same material.

According to example embodiments, the semiconductor substrate may include a cell array region having active regions and isolation regions, and a peripheral circuit region located around the cell array region, and forming the stacked structure of the first mask patterns and the second mask patterns may include forming a first film in the cell array region and the peripheral circuit region, the first film constituting the first mask layer for forming the first mask patterns in the cell array region and constituting a conductive layer for gates in the peripheral circuit region, forming the second mask patterns on the first film in the cell array region, forming the first mask patterns by patterning the first film using the second mask patterns as an etch mask in the cell array region, and forming a peripheral circuit gate including the first film in the peripheral circuit region.

According to example embodiments, when buried gates are formed in a cell array region, a stacked structure of sequentially stacking first mask patterns and second mask patterns having equal widths to respectively expose active regions and isolation regions of a semiconductor substrate may be formed. Then, only a width of the first mask patterns may be decreased to form reduced first mask patterns. Therefore, a space with a greater width than an inner width of the trench may be provided around an entrance of the trench, so that an inside of the trench may be more consistently filled with a gate material when the gate material is buried into the trench to reduce or prevent defects such as voids from occurring in the trench and thereby fabricating a more reliable transistor.

According to example embodiments, there is provided a method of manufacturing a semiconductor device including forming mask patterns on a substrate with a first plurality of widths to expose active regions and isolation regions of a semiconductor substrate, forming trenches in the active regions with a second plurality of widths and the isolation regions by etching exposed portions of the semiconductor substrate using the second mask patterns as an etch mask, wherein each of the corresponding first plurality of widths is wider than each of the corresponding second plurality of widths, forming gate insulating films on inner walls of the trenches in the active regions, and burying a conductive material into the trenches in the active regions and the isolation regions to form gates.

Example embodiments include widening an aperture or opening above a trench, in order to facilitate filling the trench, without voids. In example embodiments, widening the aperture or opening above a trench may be achieved by additional etching of a mask pattern to reduce its width, by forming and then removing a side wall film, or by any other known technique.

Although example embodiments a first mask layer, a second mask layer, and/or a third mask layer, any or all of these mask layers may be composed of one or more layers.

BRIEF DESCRIPTION OF THE DRAWINGS

The above and other features and advantages will become more apparent by describing in detail example embodiments thereof with reference to the attached drawings in which.

DETAILED DESCRIPTION OF EXAMPLE EMBODIMENTS

Figure 1:
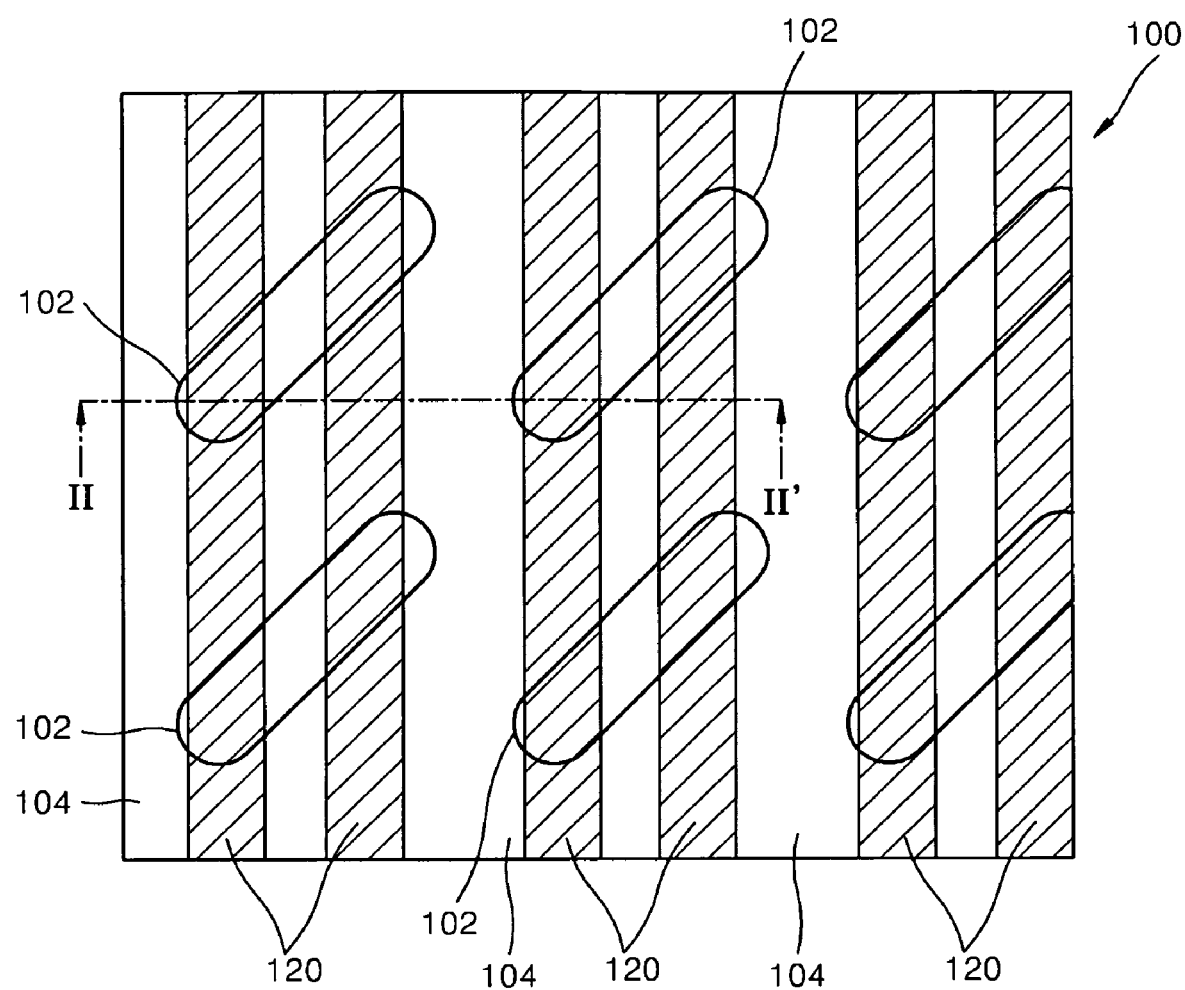
FIG. 1 is a layout illustrating a planar arrangement of a plurality of word lines forming gates, which may be embodied by a method of manufacturing a semiconductor device, according to example embodiments.

Example embodiments will now be described more fully with reference to the accompanying drawings, in which example embodiments are shown. Example embodiments may, however, be embodied in many different forms and should not be construed as being limited to the example embodiments set forth herein; rather, example embodiments are provided so that this disclosure will be thorough and complete, and will fully convey the concept of the invention to one skilled in the art. In the drawings, the thicknesses of layers and regions are exaggerated for clarity. Like reference numerals in the drawings denote like elements, and thus, their description will not be repeated.

Example embodiments of the present invention will be more clearly understood from the detailed description taken in conjunction with the accompanying drawings.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Now, in order to more specifically describe example embodiments of the present invention, various embodiments of the present invention will be described in detail with reference to the attached drawings. However, the present invention is not limited to the example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Although the example embodiments of the present invention have been disclosed for illustrative purposes, those skilled in the art will appreciate that various modifications, additions and substitutions are possible, without departing from the scope and spirit of the invention as disclosed in the accompanying claims.

FIG. 1 is a layout illustrating a planar arrangement of a plurality of word lines 120 providing gates, which may be embodied by a method of manufacturing a semiconductor device, according to example embodiments.

Referring to FIG. 1, the word lines 120 extend in a predetermined or desired direction by traversing over a plurality of active regions 102 that may be rectangular shaped with circular ends and may be formed in a cell array region and isolation regions 104 defining the active regions 102 of a semiconductor substrate 100. The word lines 120 may each be buried into the cell region of the semiconductor substrate 100.

A specific shape and construction of the active regions 102 and the word lines 120 illustrated in the layout of FIG. 1 are provided simply for illustrative purposes, however, other diverse shapes and arrangements may be formed within the scope of example embodiments.

A method of embodying a buried gate provided by the word line 120 illustrated in the layout of FIG. 1 will be provided as an example to describe the method of manufacturing a semiconductor device according to example embodiments.

FIGS. 2A through 2K are sectional views illustrating the method of manufacturing the semiconductor device according to example embodiments.

FIGS. 2A through 2K illustrate a cell array region CELL and a peripheral circuit region PERI of the semiconductor substrate 100. In FIGS. 2A through 2K, the cell array region CELL corresponds to a section taken along a line II-II' of FIG. 1.

Figure 2A:
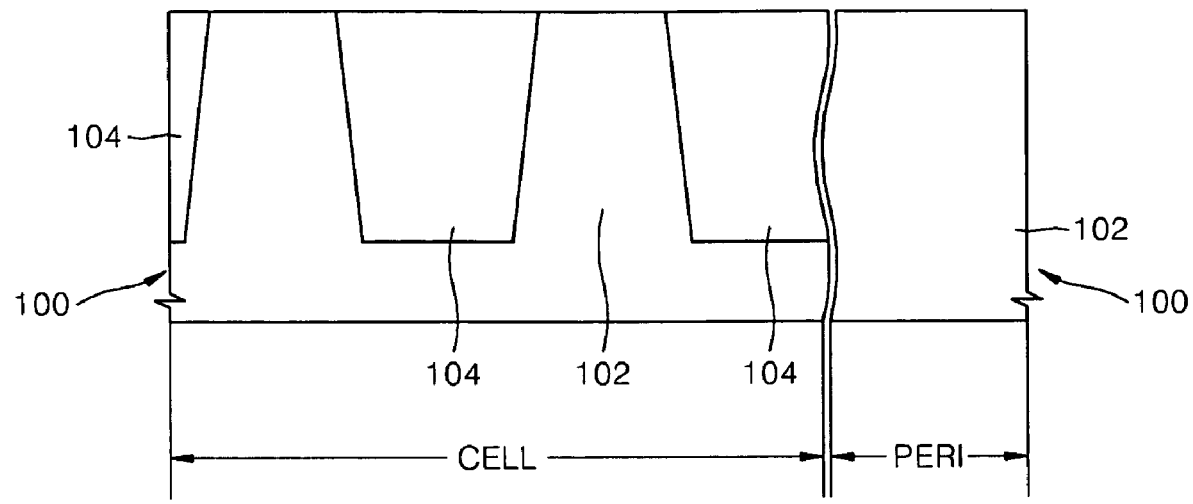
FIGS. 2A through 2K are sectional views illustrating a method of manufacturing a semiconductor device according to example embodiments.

Referring to FIG. 2A, the isolation regions 104, which define the active regions 102 and may have a predetermined or desired shape, are formed in the cell array region CELL and the peripheral circuit region PERI of the semiconductor substrate 100. In FIG. 2A, only an active region 102 portion is illustrated in the peripheral circuit region PERI.

Figure 2B:
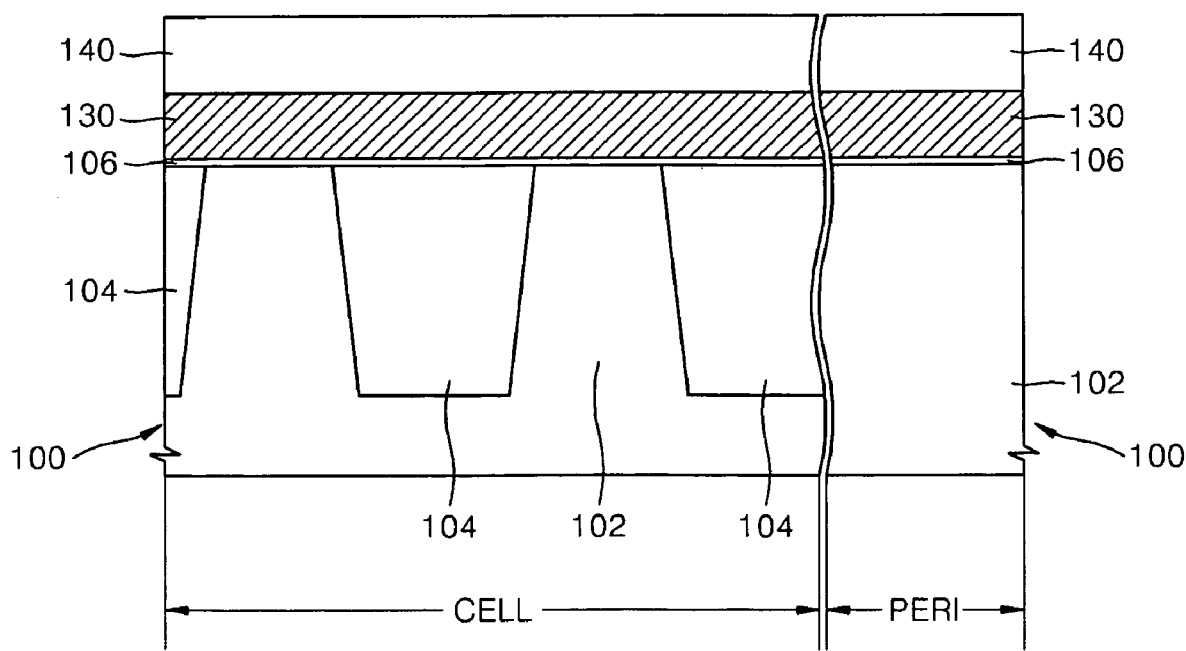

Referring to FIG. 2B, an insulating film 106 may be formed on the cell array region CELL and the peripheral circuit region PERI, and a first mask layer 130 and a second mask layer 140 may be sequentially formed on the insulating film 106. The first mask layer 130 may be composed of polysilicon, and the second mask layer 140 may be composed of silicon nitride. The insulating film 106 may be provided to form a gate insulating film of a transistor which will be formed on the peripheral circuit region PERI. The first mask layer 130 may be used as an etch mask for forming a trench where a buried gate will be formed in the cell array region CELL. Also, in the peripheral circuit region PERI, the first mask layer 130 may be used as an electrode material partially constituting a gate of the transistor which will be formed on the peripheral circuit region PERI.

Figure 2C:
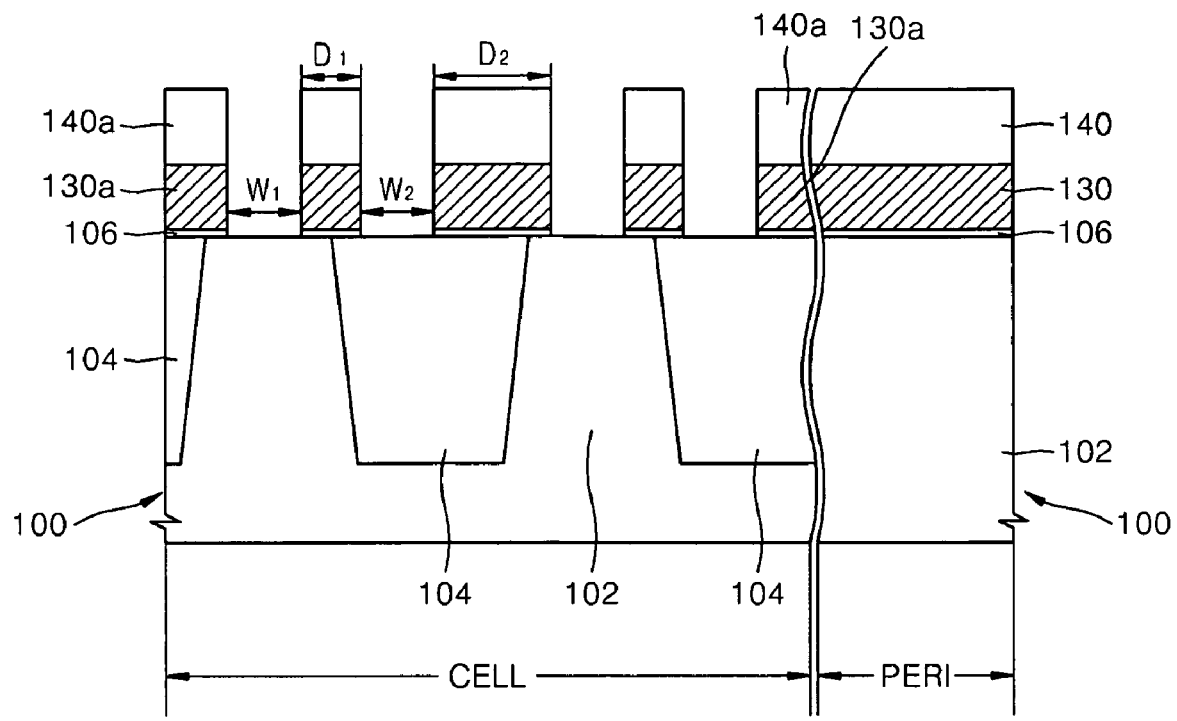

Referring to FIG. 2C, the insulating film 106, the first mask layer 130 and the second mask layer 140 are selectively patterned solely in the cell array region CELL by, for example, photolithography and thereby, forming first mask patterns 130a and second mask patterns 140a in the cell array region CELL. For this processing, when the second mask layer 140, the first mask layer 130 and the insulating film 106 are selectively etched only in the cell array region CELL, the second mask layer 140 in the peripheral circuit region PERI may be covered with a predetermined or desired mask layer (not shown) such as a photoresist mask. Consequently, in the cell array region CELL, each of the active regions 102 may be partially exposed by a first width $W_1$ in the semiconductor substrate 100 through the first mask patterns 130a and the second mask patterns 140a. Also, each of the isolation regions 104 may be partially exposed by a second width $W_2$ through the first mask patterns 130a and the second mask patterns 140a.

Photolithography using a photoresist pattern (not shown) may be employed in order to form the first mask patterns 130a and the second mask patterns 140a in the cell array region CELL. Otherwise, if the first mask patterns 130a and the second mask patterns 140a are formed to have a finer pitch and a finer dimension which exceed the resolution restrictions of photolithography, double patterning may be used to form the first mask patterns 130a and the second mask patterns 140a from the first mask layer 130 and the second mask layer 140 as will be described later in detail.

Referring to FIG. 2C, the first mask patterns 130a and the second mask patterns 140a formed in the cell array region CELL may be asymmetrically formed such that two adjacent patterns have different dimensions $D_1$ and $D_2$. This is because of the mutual arrangement relation of the active regions 102 and the word lines 120 as illustrated in the layout illustrated in FIG. 1.

Figure 2D:
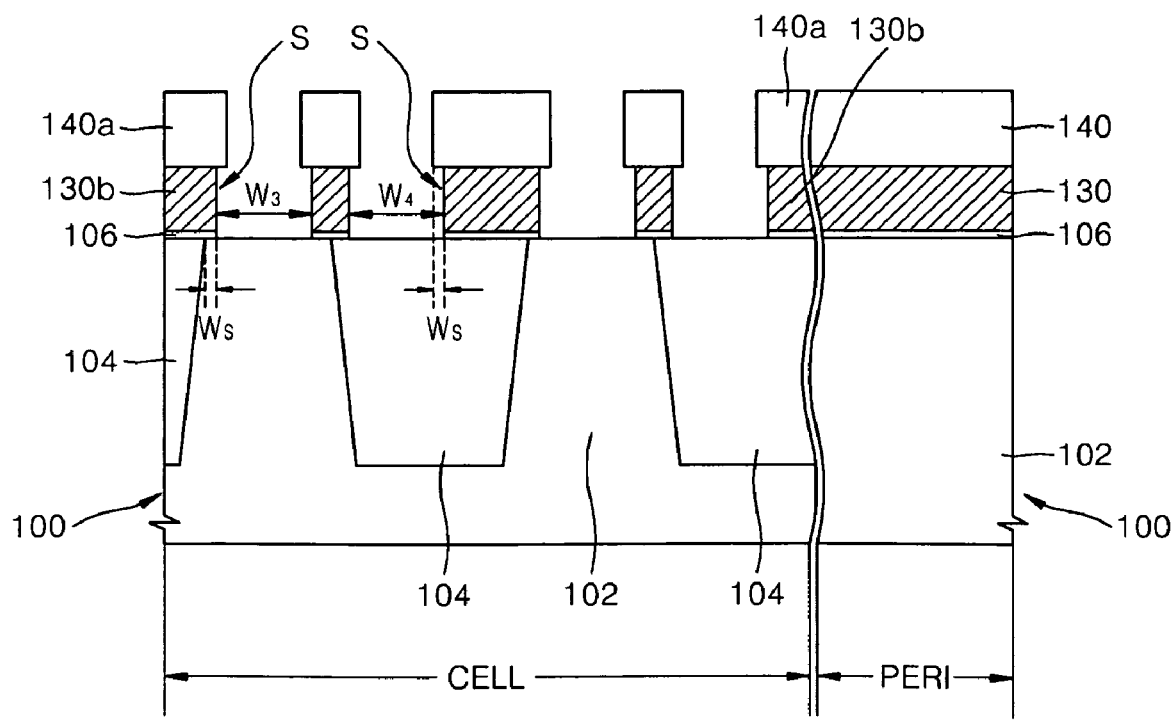

Referring to FIG. 2D, sidewalls of the first mask patterns 130a in the cell array region CELL may be removed by as much as a predetermined or desired width and thereby, forming reduced first mask patterns 130b of which the width is smaller than that of the second mask patterns 140a. Accordingly, the width of the relatively thin insulating film 106 may be similarly reduced as the reduced first mask patterns 130b. However, example embodiments are not limited thereto, however, in some cases, the width of the insulating film 106 is not decreased or may be decreased less than that of the reduced first mask patterns 130b.

After obtaining the reduced first mask patterns 130b, spaces S of a predetermined or desired width $W_s$ may be formed around the sidewalls of the reduced first mask patterns 130b under the second mask patterns 140a. Also, in the cell array region CELL, each of the active regions 102 may be partially exposed by a third width $W_3$ through the reduced first mask patterns 130b and the second mask patterns 140a, wherein the third width $W_3$ may be greater than the first width $W_1$ in the semiconductor substrate 100, and each of the isolation regions 104 may be partially exposed by a fourth width $W_4$ greater than the second width $W_2$.

In order to form the reduced first mask patterns 130b, isotropic dry etching including isotropic chemical dry etching (CDE) or isotropic wet etching may be used to remove a predetermined or desired thickness from the sidewalls of the first mask patterns 130a. If the first mask patterns 130a are composed of polysilicon, isotropic CDE using an etchant including, e.g., $CF_4$, may be performed to remove the sidewalls of the first mask patterns 130a. For example, isotropic CDE using a mixed gas of $CF_4$ and $O_2$, or a mixed gas of $CF_4$, $O_2$, $N_2$ and HF may be used. Alternatively, if the first mask patterns 130a are composed of polysilicon, an etchant mixed in a volume ratio of $NH_4OH:H_2O_2:H_2O=4:1:95$ may be used in order to remove a predetermined or desired thickness from the sidewalls of the first mask patterns 130a using isotropic wet etching.

Otherwise, in order to form the reduced first mask patterns 130b, the predetermined or desired thicknesses of the first mask patterns 130a may be thermally oxidized through the exposed surfaces of the first mask patterns 130a under an oxygen ambient to form an oxide film having a predetermined thickness along the sidewalls of the first mask patterns 130a, and then, the oxide film formed along the sidewalls may be removed by wet etching, which is conventionally used for removing a conventional oxide film. When the first mask patterns 130a are composed of polysilicon, an etchant including fluoride (F) may be used to remove the oxide film formed along the sidewalls of the first mask patterns 130a. For example, the etchant may be diluted HF (DHF), $NH_4F$ or a combination of these chemicals. For example, the etchant may be DHF obtained by mixing pure water and HF in a volume ratio of 50:1. Alternatively, dry etching may be performed using an etchant including fluoride to remove the oxide film formed along the sidewalls of the first mask patterns 130a. For example, CxFy (where x and y are integers between 1-10) may be used as the etchant. Otherwise, a mixed gas obtained by mixing CxFy and $O_2$, or mixing CxFy, $O_2$ and Ar may be used as the etchant. The CxFy gas may be $C_3F_6$, $C_4F_6$, $C_4F_8$ or $C_5F_8$, for example.

Figure 2E:
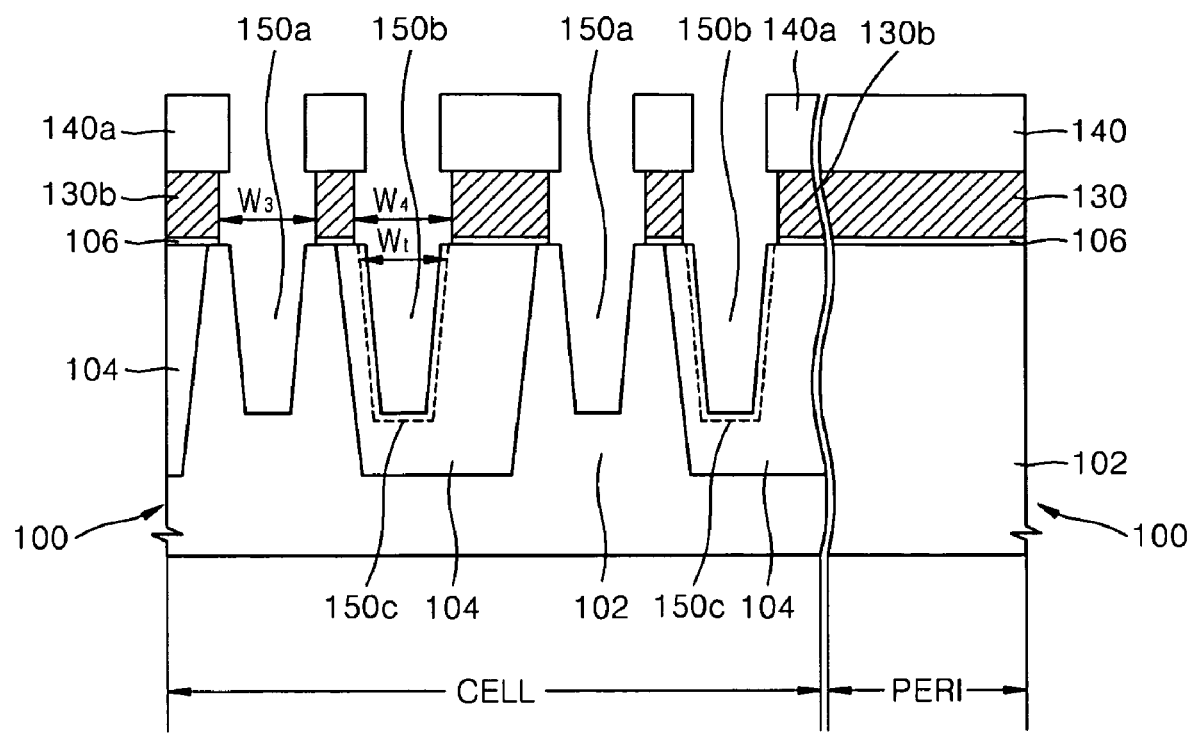

Referring to FIG. 2E, the second mask patterns 140a may be used as an etch mask in the cell array region CELL to etch the exposed active regions 102 and the exposed isolation regions 104 of the semiconductor substrate 100 and thereby, form trenches 150a and 150b for forming buried gates.

Thereafter, a natural oxide film may be removed from the inner walls of the trenches 150a and 150b by stripping using an SC1 cleansing solution (a mixture of $NH_4OH$, $H_2O_2$ and $H_2O$), a mixture of an SC1 cleansing solution and an HF solution, or $O_3$. In example embodiments, because the isolation regions 104 are mostly composed of an oxide film, a predetermined or desired thickness of the inner walls of the trenches 150b formed in the isolation regions 104 may be consumed when the natural oxide film is removed from the inner walls of the trenches 150a and 150b. Thus, the width of each of the trenches 150b may be slightly increased to have a width Wt as denoted by dotted line 150c of FIG. 2E. However, when the predetermined or desired width of the sidewalls of the first mask patterns 130a is removed to form the reduced first mask patterns 130b, the reduced first mask patterns 130b may be formed such that the width, e.g., the fourth width $W_4$ denoted in FIG. 2D, of the space S defined by the reduced first mask patterns 130b over the entrance of each of the trenches 150b may be greater than a width Wt of each of the trenches 150b denoted by the dotted line 150c. By forming the reduced first mask patterns 130b as above, the entrance width of each of the trenches 150b formed in the isolation regions 104 cannot be less than the inner width of each of the trenches 150b even after removing the natural oxide films from the inner walls of the trenches 150a and 150b.

Figure 2F:
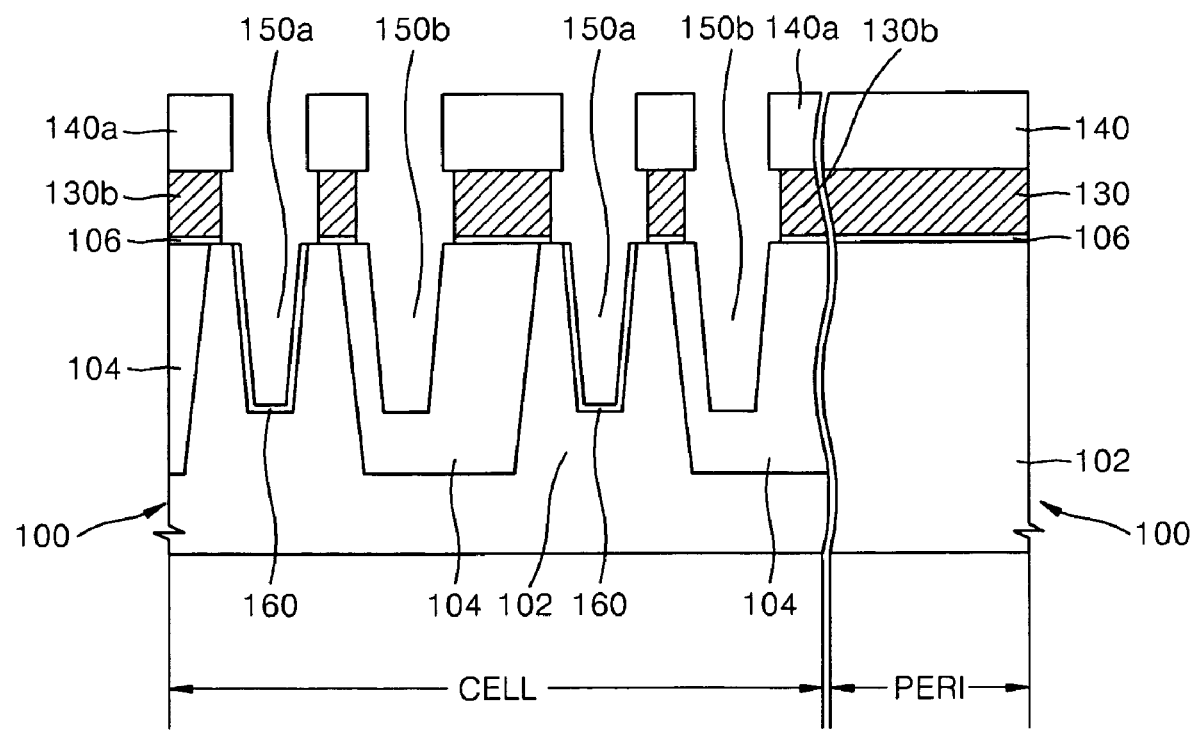

Referring to FIG. 2F, the inner walls of the trenches 150a formed in the active regions of the semiconductor substrate 100 may be oxidized to form gate insulating films 160.

Figure 2G:
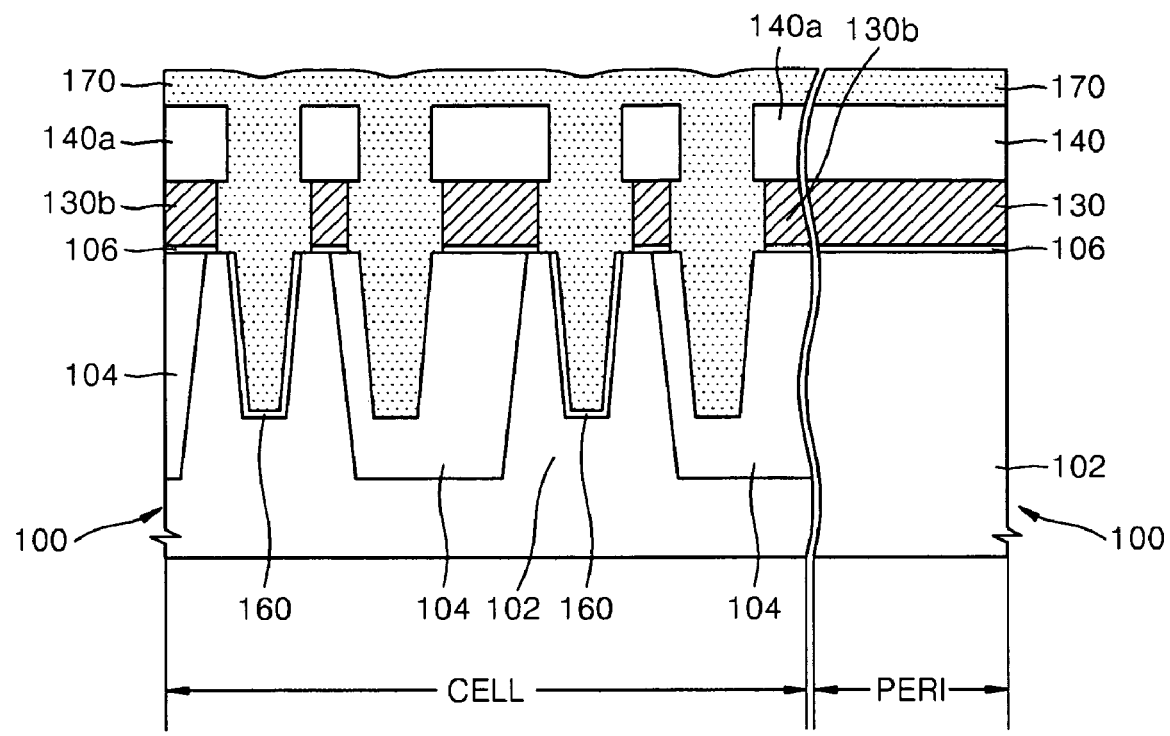

Referring to FIG. 2G, a conductive material may be deposited on an entire surface of the semiconductor substrate 100 including the cell array region CELL and the peripheral circuit region PERI, so as to be completely buried into the trenches 150a and 150b covered with the gate insulating films 160 and thereby, forming a cell gate conductive layer 170. The cell gate conductive layer 170 may be composed of a metal or metal nitride. Hence, the cell gate conductive layer 170 may be composed of TiN, for example.

As described above with reference to FIG. 2E, because a greater width is secured in the entrances of each of the trenches 150a and 150b than the inner width of each of the trenches 150a and 150b by the spaces defined by the reduced first mask patterns 130b, the conductive material deposited within the trenches 150a and 150b for forming the cell gate conductive layer 170 may be satisfactorily buried into the trenches 150a and 150b without causing defects including voids.

Figure 2H:
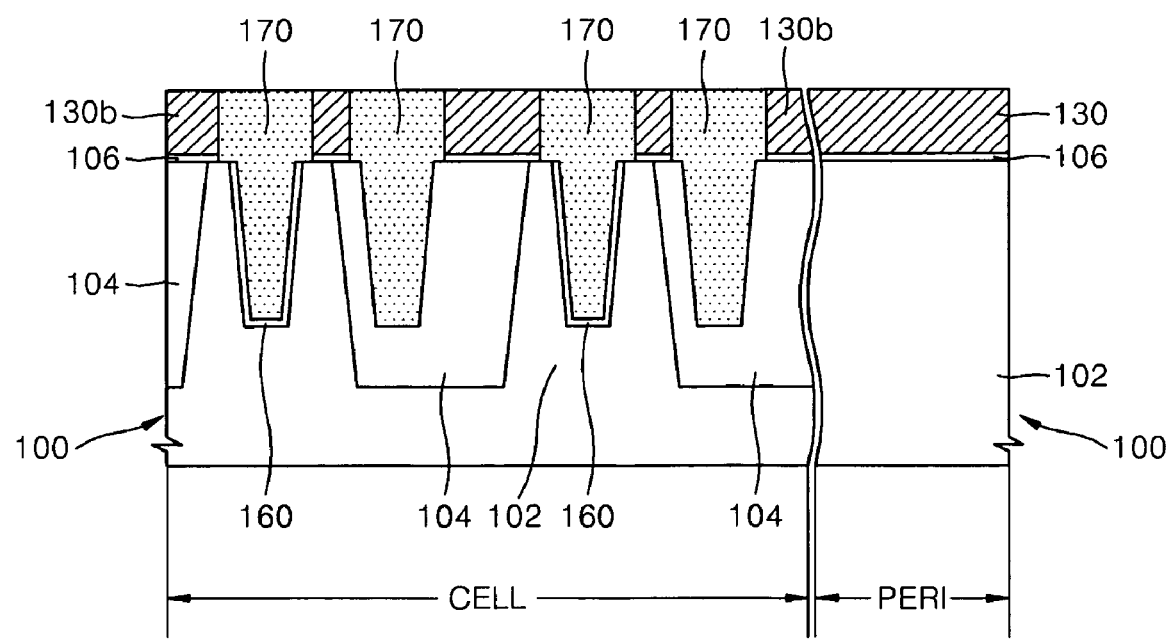

Referring to FIG. 2H, the exposed cell gate conductive layer 170 from upper surfaces of the cell array region CELL and the peripheral circuit region PERI may be removed. Then, the second mask patterns 140a of the cell array region CELL and the second mask layer 140 of the peripheral circuit region PERI exposed by the removal of the cell gate conductive layer 170 may be completely removed and thereby, exposing the upper surfaces of the reduced first mask patterns 130b in the cell array region CELL and the upper surfaces of the first mask layer 130 in the peripheral circuit region PERI, respectively.

Figure 2I:
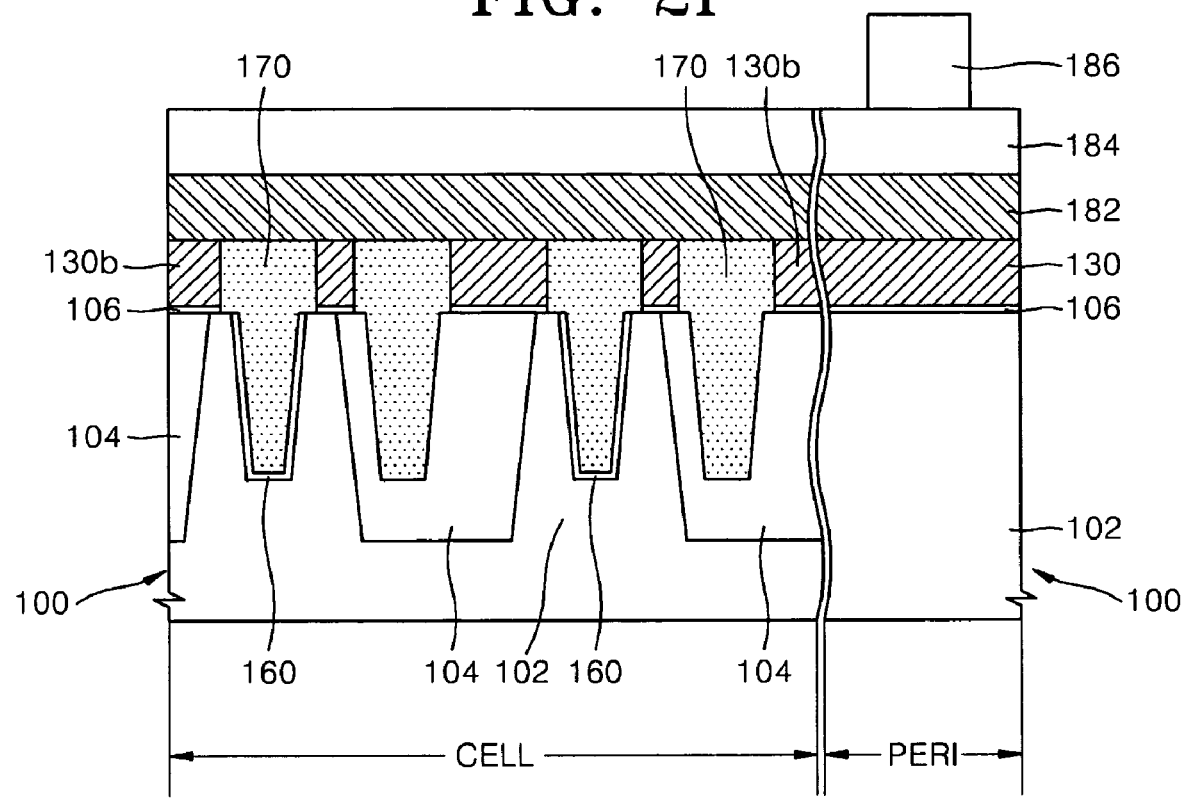

Referring to FIG. 2I, a peripheral circuit gate conductive layer 182 and a capping layer 184 may be sequentially formed on the reduced first mask patterns 130b and the first mask layer 130 of the cell array region CELL and the peripheral circuit region PERI. The peripheral circuit gate conductive layer 182 may be composed of metal silicide. The capping layer 184 may be an insulating film. For example, the peripheral circuit gate conductive layer 182 may be composed of tungsten silicide, and the capping layer 184 may be composed of silicon nitride.

Then, a photoresist pattern 186 covering solely a region of the peripheral circuit region PERI where a gate will be formed may be formed on the capping layer 184.

Figure 2J:
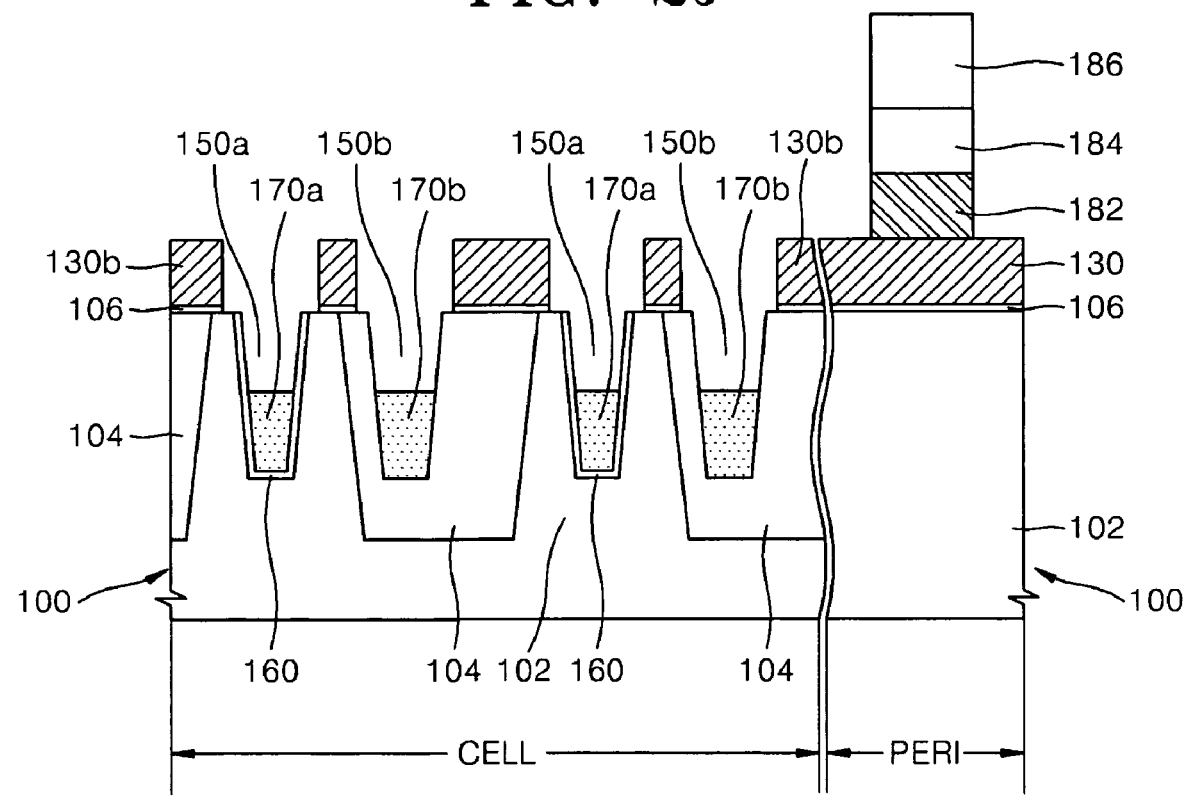

Referring to FIG. 2J, using the photoresist pattern 186 as an etch mask, the exposed portions of the capping layer 184 and the peripheral circuit gate conductive layer 182 may be etched-back in the cell array region CELL and the peripheral circuit region PERI. Then, the cell gate conductive layer 170 exposed by removing the peripheral circuit gate conductive layer 182 may be etched-back down to a predetermined or desired depth and thereby, remaining cell gates 170a and 170b, which may partially fill up the trenches 150a and 150b from their the bottom surfaces, are formed. In example embodiments, because the cell gate conductive layer 170 having improved fill-in characteristics with no defects such as voids is buried within the trenches 150a and 150b, the recess quantity of the cell gate conductive layer 170 may be more uniformly controlled when etching-back the cell gate conductive layer 170 to form the cell gates 170a and 170b with a desired shape within the trenches 150a and 150b. The cell gates 170a and 170b within the trenches 150a and 150b may each constitute the word lines 120 of FIG. 1.

Figure 2K:
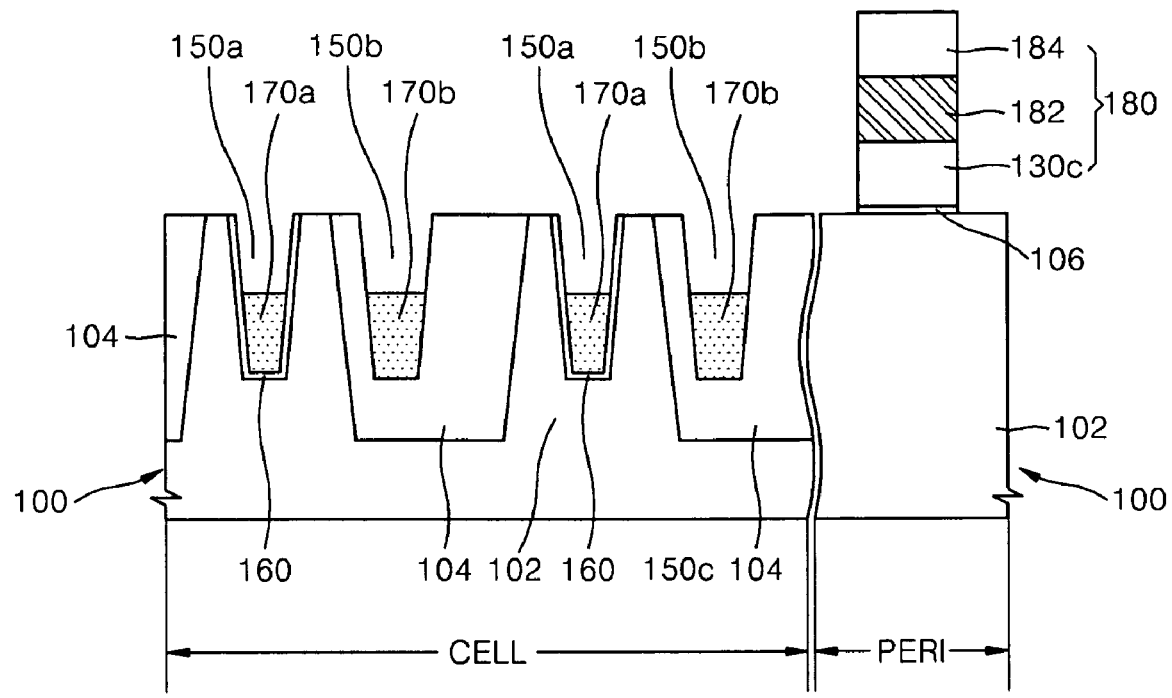

Referring to FIG. 2K, using the photoresist pattern 186 and the capping layer 184 formed in the peripheral circuit region PERI as an etch mask, the reduced first mask patterns 130b remaining on the semiconductor substrate 100 in the cell array region CELL and the first mask layer 130 exposed in the peripheral circuit region PERI may be etched-back to expose the upper surface of the semiconductor substrate 100 in the cell array region CELL and the peripheral circuit region PERI. Thereafter, the remaining photoresist pattern 186 may be removed. As a result, a mask pattern 130c formed of a resultant structure of etching the first mask layer 130 may be obtained on the semiconductor substrate 100 in the peripheral circuit region PERI. The mask pattern 130c may constitute a peripheral circuit gate 180 together with the peripheral circuit gate conductive layer 182.

Figure 3A:
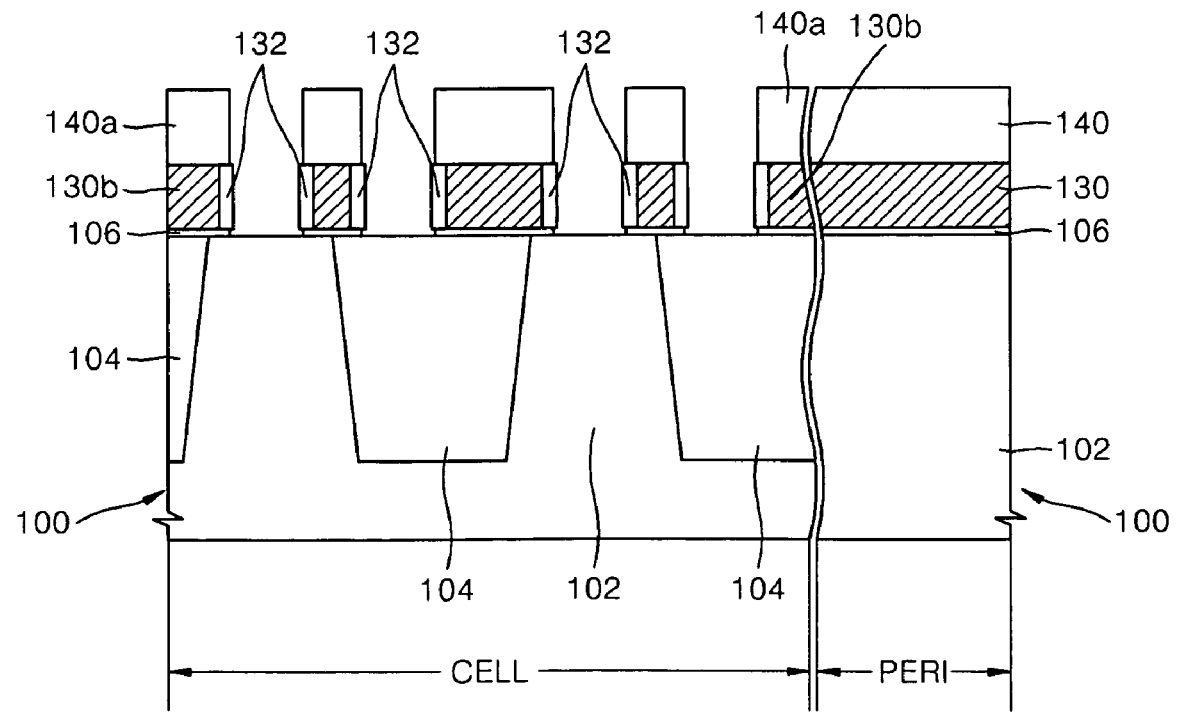
FIGS. 3A through 3C are sectional views illustrating a method of manufacturing a semiconductor device according to example embodiments.
Figure 3B:
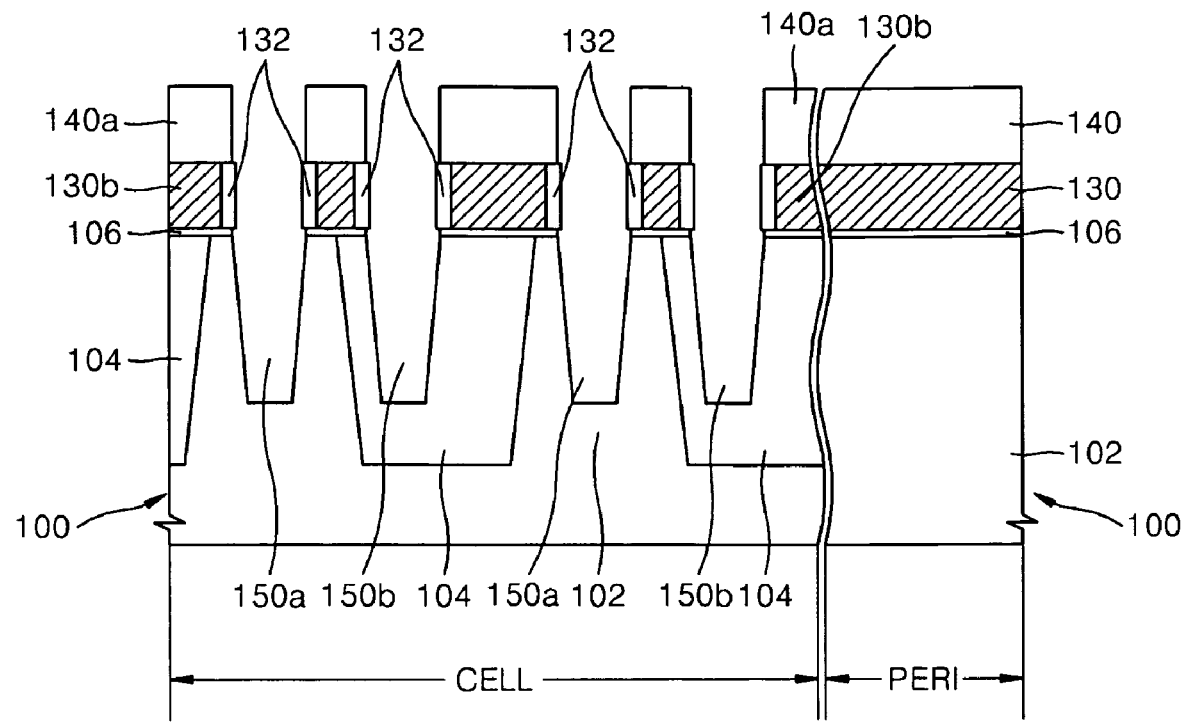
Figure 3C:
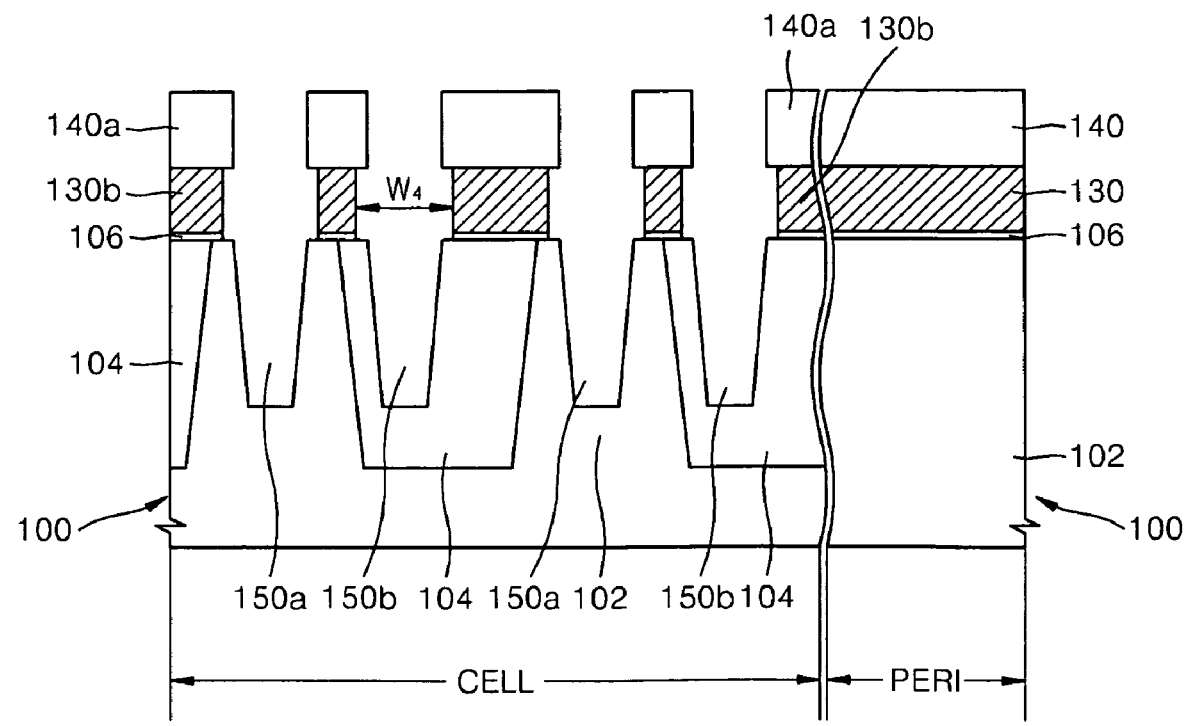

FIGS. 3A through 3C are sectional views illustrating a method of manufacturing a semiconductor device according to example embodiments.

The description of the method of manufacturing the semiconductor device according to example embodiments of FIGS. 3A-3C is similar to that of the previous example embodiments illustrated in FIGS. 2A through 2K. In FIGS. 3A through 3C, like reference numerals in the example embodiments illustrated in FIGS. 2A through 2K denote like elements. FIGS. 3A through 3C include the cell array region CELL and the peripheral circuit region PERI of the semiconductor substrate 100. The cell array region CELL illustrated in FIGS. 3A through 3C corresponds to a section taken along a line II-II' of FIG. 1.

Referring to FIG. 3A, according to example embodiments described with reference to FIGS. 2A through 2C, the first mask patterns 130a and second mask patterns 140a are formed on the semiconductor substrate 100. Then, a predetermined or desired width of the exposed sidewalls of the first mask patterns 130a are oxidized from the surfaces of the sidewalls to form sidewall oxide films 132 to a predetermined or desired thickness along the sidewalls of the first mask patterns 130a. In order to form the sidewall oxide films 132, a predetermined or desired thickness of the exposed surfaces of the first mask patterns 130a may be thermally oxidized in an oxygen ambient. In example embodiments, oxidation may be controlled to make a ratio of a growth thickness of the oxide film grown outward and an oxidized thickness formed by inward oxidation when centering relative to the exposed sidewalls of the first mask patterns 130a be about 45:55.

Referring to FIG. 3B, using the second mask patterns 140a as an etch mask in the cell array region CELL, the exposed active regions 102 and the exposed isolation regions 104 of the semiconductor substrate 100 may be etched, thereby forming trenches 150a and 150b in the active regions 102 and the isolation regions 104, respectively, to form buried gates.

Referring to FIG. 3C, the sidewall oxide films 132 remaining after forming the trenches 150a and 150b may be removed.

In order to remove the sidewall oxide films 132, wet etching for removing a conventional oxide film may be used. When the first mask patterns 130a are composed of polysilicon, an etchant including fluoride (F) may be used to remove the sidewall oxide films 132. For example, the etchant may be diluted HF (DHF), $NH_4F$ or a combination of these materials. For example, the etchant may be DHF obtained by mixing pure water and HF in a volume ratio of 50:1. Also, dry etching may be performed using an etchant including fluoride to remove the sidewall oxide films 132 formed along the sidewalls of the first mask patterns 130a. For example, $C_xF_y$ (where x and y are integers between 1~10) may be used as the etchant. Otherwise, a mixed gas obtained by mixing $C_xF_y$ and $O_2$, or mixing $C_xF_y$, $O_2$ and Ar may be used as the etchant. For example, $C_xF_y$ gas may be $C_3F_6$, $C_4F_6$, $C_4F_8$ or $C_5F_8$.

Thereafter, a natural oxide film may be removed from the inner walls of the trenches 150a and 150b by the method described with reference to FIG. 2E.

While removing the sidewall oxide films 132 and removing the natural oxide film, a predetermined or desired thickness of each of the inner walls of the trenches 150b is consumed, so that the width of each of the trenches 150b is likely to slightly increase as described with reference to FIG. 2E. However, the reduced first mask patterns 130b are formed by removing the sidewall oxide films 132 from the first mask patterns 130a, and thus a width, e.g., a fourth width $W_4$, defined by the reduced first mask patterns 130b is greater than the entrance width of each of the trenches 150b.

Then, the processing as described with reference to FIGS. 2G through 2K may be performed to form cell gates 170a and 170b in the cell array region CELL and a peripheral circuit gate 180 in the peripheral circuit region PERI.

FIGS. 4A through 4E are sectional views illustrating a method of manufacturing a semiconductor device according to example embodiments.

The description of methods of manufacturing the semiconductor device according to example embodiments of FIGS. 4A-4E may be similar to that of the example embodiments illustrated with reference to FIGS. 2A through 2K, with some differences. In methods of manufacturing the semiconductor device according to example embodiments, a double patterning may be used to form the first mask patterns 130a and the second mask patterns 140a as illustrated in FIG. 2C. In FIGS. 4A through 4E, like reference numerals in example embodiments illustrated with reference to FIGS. 2A through 2K denote like elements. Also, only the cell array region CELL of the semiconductor substrate 100 is illustrated. The cell array region CELL in FIGS. 4A through 4E corresponds to a section taken along a line II-II' of FIG. 1.

Figure 4A:
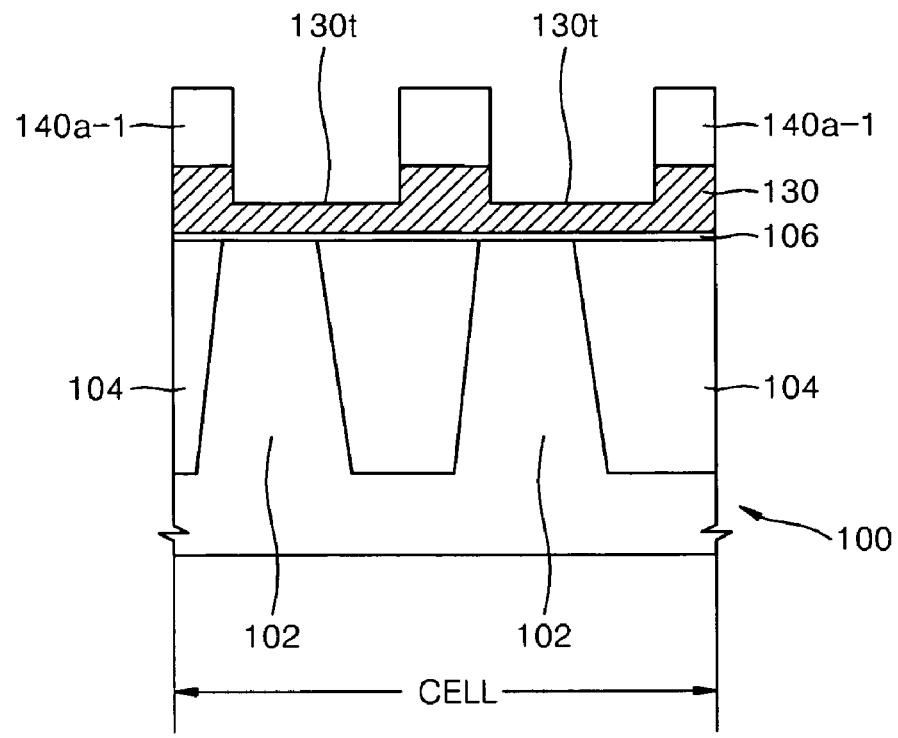
FIGS. 4A through 4C are sectional views illustrating a method of manufacturing a semiconductor device according to or desired.

Referring to FIG. 4A, as described with reference to FIGS. 2A and 2B, the insulating film 106 may be formed on the cell array region CELL and the peripheral circuit region PERI on the semiconductor substrate 100, and the first mask layer 130 and the second mask layer 140 may be sequentially formed on the insulating film 106.

Thereafter, the second mask layer 140 may be patterned using photolithography to form first portions 140a-1 of second mask patterns 140a. The first portions 140a-1 of second mask patterns 140a may include a plurality of first patterns repeated at a predetermined or desired pitch. In example embodiments, when the second mask layer 140 is etched to form the first portions 140a-1 of the second mask patterns 140a, exposed portions of the first mask layer 130 may be consumed from the upper surface of the first mask layer 130 to a predetermined or desired depth by over-etching as illustrated in FIG. 4A in order to form recessed surfaces 130t.

Figure 4B:
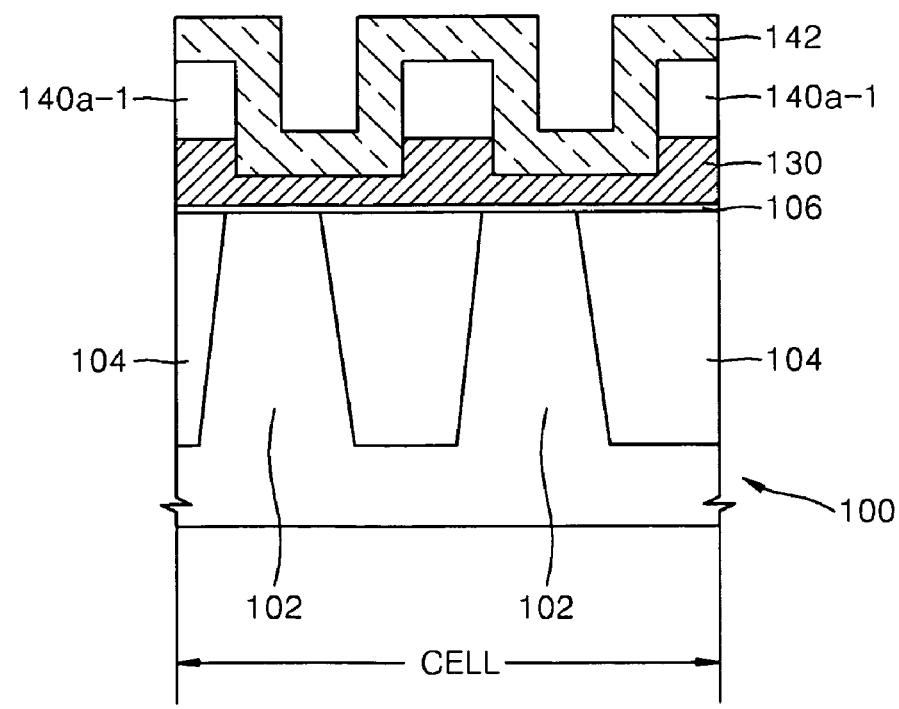

Referring to FIG. 4B, a sacrificial film 142 may cover the first portions 140a-1 of the second mask patterns 140a and the recessed surfaces 130t of the first mask layer 130. The sacrificial film 142 may be composed of a material constituting the first mask layer 130. For example, the sacrificial film 142 may be composed of polysilicon. A dented or recessed portion may be formed between adjacent first portions 140a-1 in the upper surface of the sacrificial film 132.

Figure 4C:
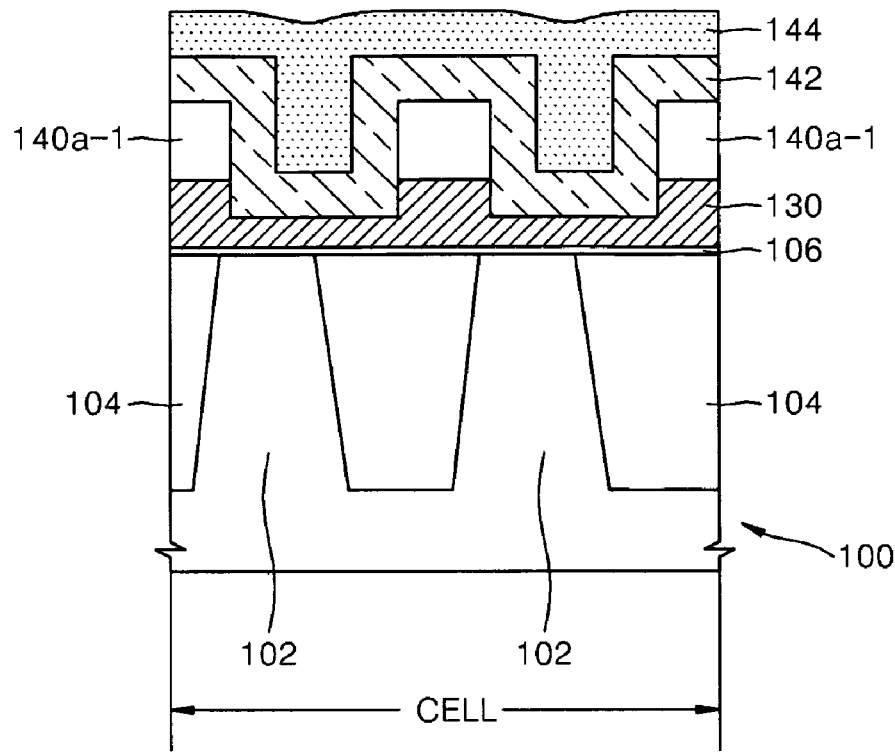

Referring to FIG. 4C, a third mask layer 144 may be formed on the sacrificial film 142 to fill the dented or recessed portions in the sacrificial film 142. The third mask layer 144 may be composed of a material having etch characteristics similar to those of the second mask layer 140. For example, the third mask layer 144 may be composed of a material of the second mask layer 140. Alternatively, the third mask layer 144 and the second mask layer 140 may be each composed of different materials with similar etch characteristics. For example, the second mask layer 140 and the third mask layer 144 may be each composed of silicon nitride.

Figure 4D:
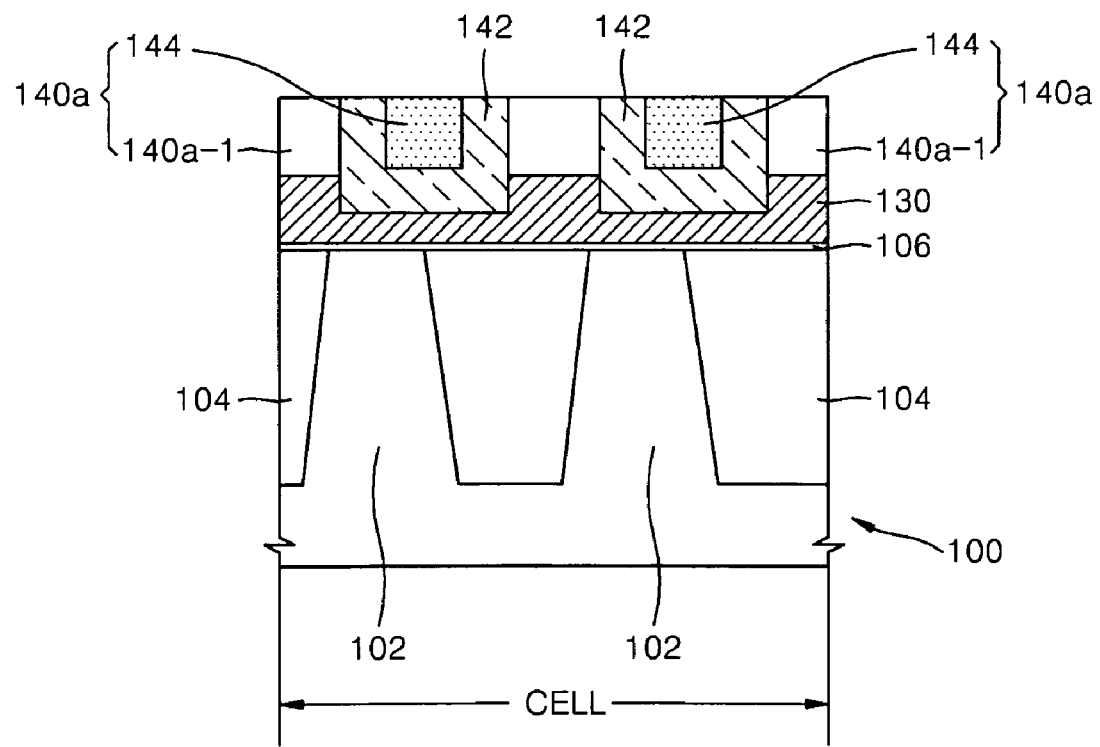

Referring to FIG. 4D, the third mask layer 144 and the sacrificial film 142 formed on the first portions 140a-1 of the second mask patterns 140a may be removed by chemical mechanical polishing (CMP) until the first portions 140a-1 of the second mask patterns 140a are exposed. Consequently, a plurality of second patterns composed of residual portions of the third mask layer 144 may be left between adjacent first patterns which constitute the first portions 140a-1 of the second mask patterns 140a. The second patterns form the other portions except for the first portions 140a-1 of the second mask patterns 140a. That is, the second patterns composed of the residual portions of the third mask layer 144 and the first portions 140a-1 of the second mask patterns 140a may constitute the second mask patterns 140a illustrated in FIG. 2C.

Figure 4E:
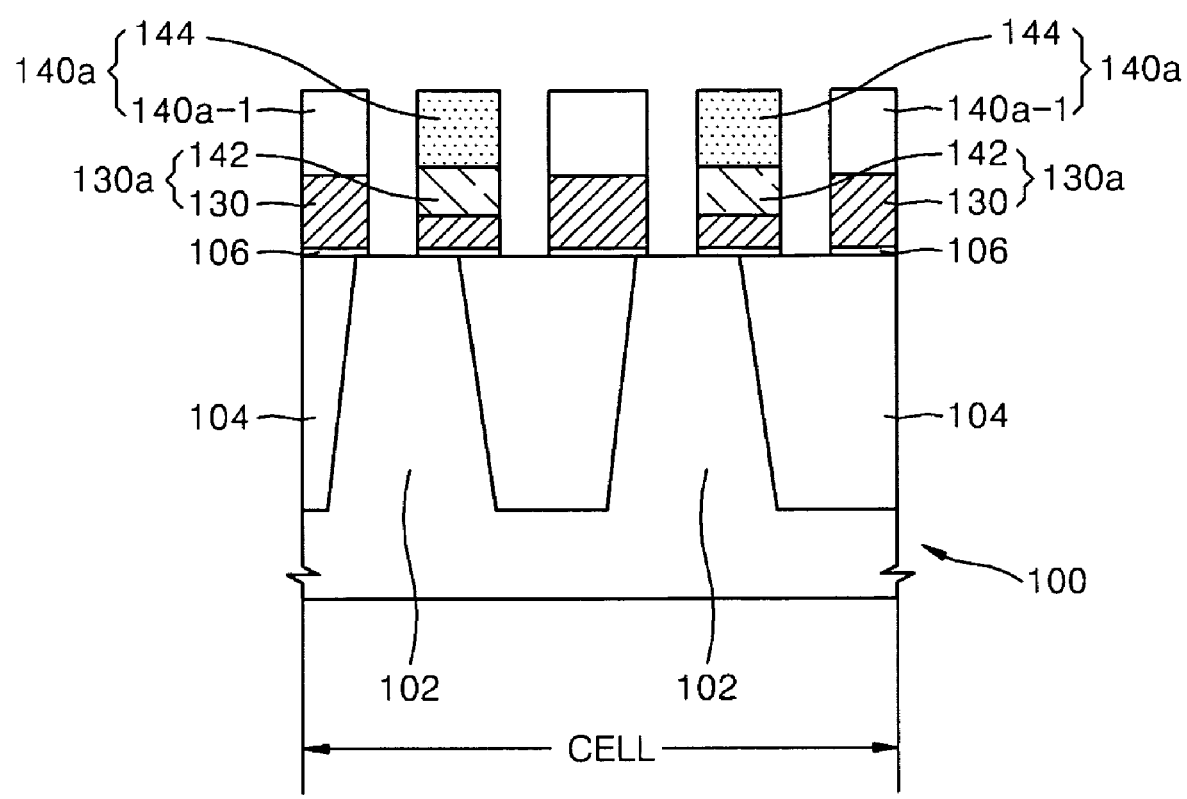

Referring to FIG. 4E, using the residual portions of the third mask layer 144 and the first portions 140a-1 of the second mask patterns 140a as etch masks, the sacrificial film 142, the underlying first mask layer 130 and the insulating film 106 exposed between the etch masks may be sequentially etched and thereby, exposing upper surfaces of the semiconductor substrate 100. As the result, mask patterns composed of the residual portions of the first mask layer 130 and the residual portions of the sacrificial film 142 may be formed under the residual portions of the third mask layer 144 and the first portions 140a-1 of the second mask patterns 140a on the semiconductor substrate 100. The mask patterns formed of the residual portions of the first mask layer 130 and the residual portions of the sacrificial film 142 correspond to the first mask patterns 130a illustrated in FIG. 2C.

Thereafter, the processing described with reference to FIGS. 2D through 2K may be performed to form cell gates 170a and 170b in the cell array region CELL and the peripheral circuit gate 180 in the peripheral circuit region PERI.

Figure 5A:
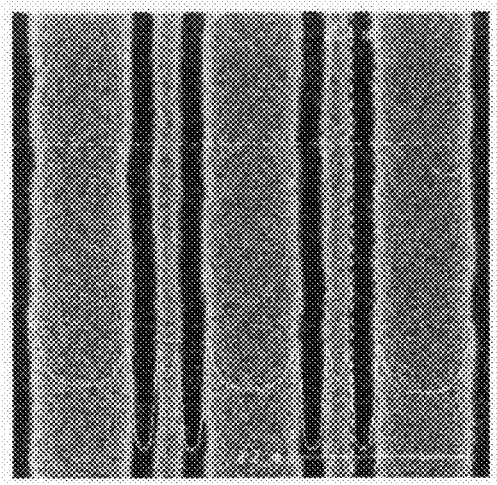
FIGS. 5A through 5C are conventional scanning electron microscope (SEM) photographs each showing experiment results of comparative examples to evaluate effects resulting from a method of manufacturing a semiconductor device according to example embodiments.
Figure 5B:
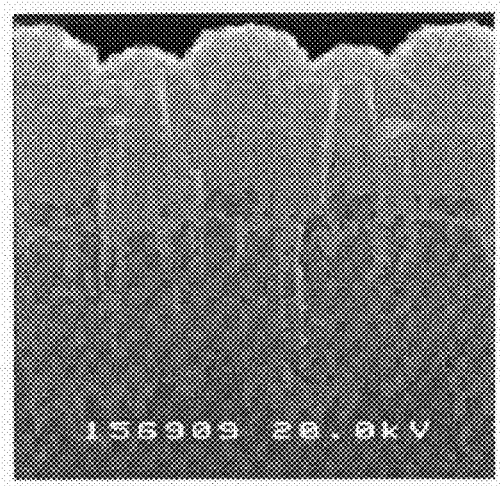
Figure 5C:
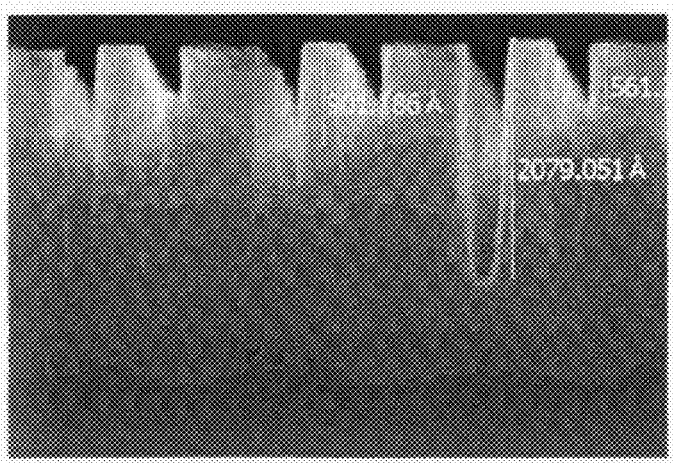

FIGS. 5A through 5C are conventional scanning electron microscope (SEM) photographs each showing experiment results of comparative examples to evaluate effects resulting from methods of manufacturing a semiconductor device according to example embodiments.

For example, FIG. 5A is a conventional SEM photograph showing an upper surface where second mask patterns 140 were exposed when the reduced first mask patterns 130b described with reference to FIG. 2D were not formed after forming first mask patterns 130 and second mask patterns 140 as illustrated in FIG. 2C. In FIG. 5A, the width of a silicon substrate exposed between each of the first mask patterns 130 was 26 nm.

FIG. 5B is a conventional SEM photograph showing a section of trenches immediately after depositing TiN within the trenches which are formed by etching a silicon substrate using the second mask patterns 140 as an etch mask and covering a gate oxide film on an inner wall of the trenches.

FIG. 5C is a conventional SEM photograph showing a result of etching-back TiN from upper surfaces of the trenches to remain with cell gates composed of TiN on bottom portions of the trenches.

As can be noted from FIGS. 5A, 5B and 5C, decreasing of the width of the second mask patterns 140 was deleted after forming the first mask patterns 130 and the second mask patterns 140 illustrated in FIG. 2C. As the result, an entrance of the trenches was relatively narrow when filling TiN within the trench to deteriorate fill-in characteristic of TiN within the trenches. In turn, a recessed quantity of TiN is too small or excessive in each of the trenches as shown in FIG. 5C after the etching back of TiN, so that the remaining cell gate material cannot attain a desired shape.

Figure 6A:
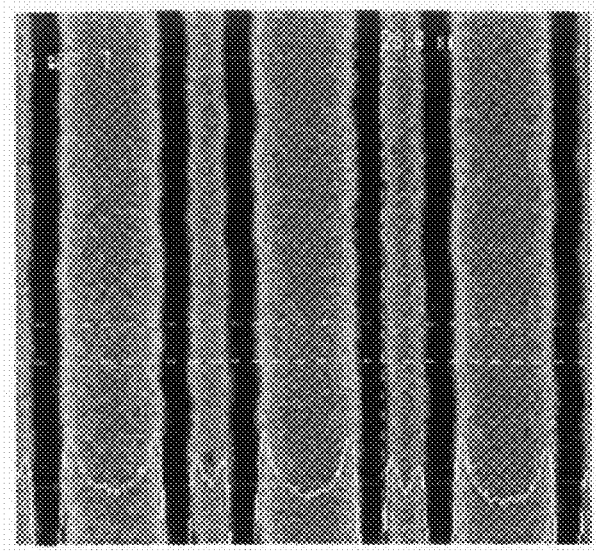
FIGS. 6A and 6B are example scanning electron microscope (SEM) photographs each showing experiment results for evaluating effects in sequence resulting from a method of manufacturing a semiconductor device according to example embodiments.
Figure 6B:
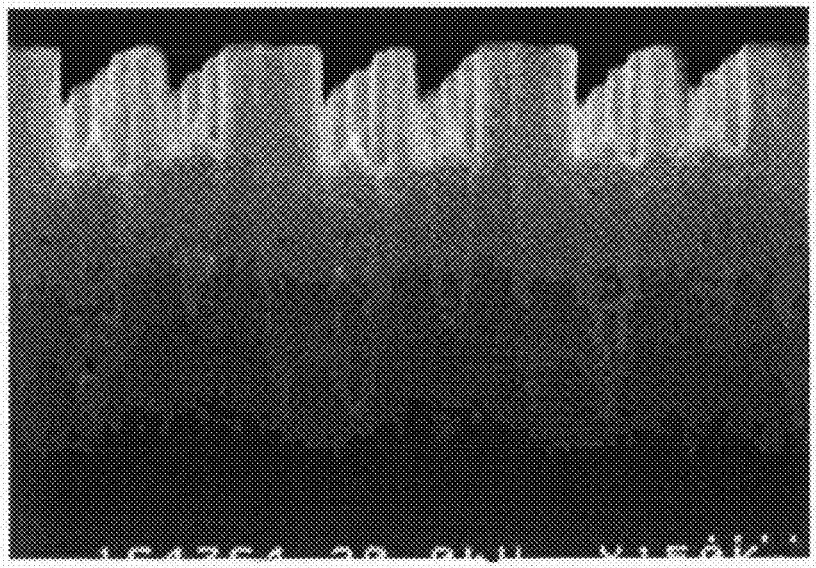

FIGS. 6A and 6B are example scanning electron microscope (SEM) photographs each showing experiment results for evaluating effects in sequence resulting from a method of manufacturing a semiconductor device according to example embodiments.

For example, FIG. 6A is an example SEM photograph showing an upper surface in which second mask patterns 140a as illustrated in FIG. 2C were exposed in a resultant structure of obtaining reduced first mask patterns 130b. The reduced first mask patterns 130b were obtained by forming first mask patterns 130 and second mask patterns 140, performing oxidation to increase the width to approximately 30 Å from one sidewall of each of the first mask patterns 130 so as to form the reduced first mask patterns 130b described with reference to FIG. 2D, and wet etching the oxidized sidewalls to be as wide as approximately 60 Å. In FIG. 6A, the width of a silicon substrate exposed between each of the reduced first mask patterns 130b was 120 nm.

FIG. 6B is an example SEM photograph showing a result of etching-back TiN from the upper surface of the trenches to remain with cell gates composed of TiN on bottom portions of the trenches after forming the trenches in a silicon substrate, forming a gate oxide film on inner walls of the trenches and depositing TiN within the trenches. As noted in FIG. 6B, more uniform-shaped cell gates were formed within respective trenches in the active regions and the isolation regions of the silicon substrate.

In a method of manufacturing a semiconductor device according to example embodiments, when buried gates are formed in a cell array region, a stacked structure of sequentially stacking first mask patterns and second mask patterns having equal widths to respectively expose active regions and isolation regions of a semiconductor substrate is formed. Then, only the width of the first mask patterns is decreased to form reduced first mask patterns. Therefore, a space with a greater width than an inner width of each of the trenches is obtained around an entrance of the trenches, so that an inside of the trenches may be more consistently filled with a gate material when the gate material is buried into the trenches to reduce or prevent defects, such as voids from occurring in the trenches and thereby, fabricating a more reliable transistor.

As set forth above, example embodiments include widening an aperture or opening above a trench, in order to facilitate filling the trench, without voids. In example embodiments, widening the aperture or opening above a trench may be achieved by additional etching of a mask pattern to reduce its width (as shown in FIGS. 2A-2K), by forming and then removing a side wall film 132 (as shown in FIGS. 3A-3c), or by any other known technique.

Although example embodiments illustrated in FIGS. 1-6B utilize a first mask layer 130, a second mask layer 140, and/or a third mask layer 144, any or all of these mask layers may be composed of one or more layers.

While example embodiments have been particularly shown and described with reference to FIGS. 1-6B, it will be understood by one of ordinary skill in the art that various changes in form and details may be made therein without departing from the spirit and scope of example embodiments, as defined by the following claims.

What is claimed is:

1. A method of manufacturing a semiconductor device comprising:

forming a stacked structure of sequentially stacked first mask patterns and second mask patterns with equal widths to expose active regions and isolation regions of a semiconductor substrate;

forming reduced first mask patterns by decreasing the width of only the first mask patterns;

forming trenches in the active regions and the isolation regions by etching the exposed portions of the semiconductor substrate using the second mask patterns as an etch mask;

forming gate insulating films on inner walls of the trenches in the active regions; and burying a conductive material into the trenches in the active regions and the isolation regions to form gates, wherein forming the gates includes completely burying the conductive material into the trenches and partially removing the conductive material buried within the trenches from entrances of the trenches to form buried gates which partially nil in the trenches from the bottom of the trenches.

2. The method of claim 1, after forming the trenches and before forming the gate insulating films, further comprising: removing natural oxide films formed along the inner walls of the trenches in the active regions and the isolation regions.

3. The method of claim 1, wherein forming the reduced first mask patterns comprises etching a width of the sidewalls of the first mask patterns using isotropic chemical dry etching (CDE).

4. The method of claim 1, wherein forming the reduced first mask patterns comprises etching a width of the sidewalls of the first mask patterns using wet etching.

5. The method of claim 1, wherein forming the reduced first mask patterns comprises oxidizing a width of the sidewalls of the first mask patterns to form sidewall oxide films along the sidewalls of the first mask patterns.

6. The method of claim 5, after forming the sidewall oxide films and before forming the trenches, further comprising removing the sidewall oxide films.

7. The method of claim 5, after forming the trenches and before forming the gate insulating film, further comprising removing the sidewall oxide films.

8. The method of claim 1, wherein the first mask patterns are polysilicon films.

9. The method of claim 1, wherein the second mask patterns are silicon nitride films.

10. The method of claim 1, wherein the conductive material is TiN.

11. The method of claim 1, wherein forming of the stacked structure of the first mask patterns and the second mask patterns comprises:

forming a first mask layer on the active regions and the isolation regions of the semiconductor substrate;

forming a second mask layer on the first mask layer; and patterning the first mask layer and the second mask layer using photolithography to form the stacked structure of the first mask patterns and the second mask patterns.

12. The method of claim 1, wherein forming the stacked structure of the first mask patterns and the second mask patterns comprises:

forming a first mask layer on the active regions and the isolation regions of the semiconductor substrate;

forming a second mask layer on the first mask layer;

patterning the second mask layer using photolithography to form first portions of the second mask patterns formed of a plurality of first patterns repeated at a pitch;

forming a sacrificial film covering the first patterns and the first mask layer;

forming second portions of the second mask patterns formed of a plurality of second patterns each being filled in spaces between adjacent patterns out of the first patterns on the sacrificial film; and etching the sacrificial film and the underlying first mask layer exposed between the first patterns and the second patterns.

13. The method of claim 12, wherein the first patterns and the second patterns are composed of the same material.

14. The method of claim 12, wherein the first patterns and the second patterns are each silicon nitride films.

15. The method of claim 12, wherein the first mask layer and the sacrificial film are composed of the same material.

16. The method of claim 12, wherein the first mask layer and the sacrificial film are composed of polysilicon.

17. The method of claim 1, wherein the semiconductor substrate comprises a cell array region having the active regions and the isolation regions, and
   a peripheral circuit region around the cell array region; and
   forming the stacked structure of the first mask patterns and the second mask patterns comprises:
   forming a first film in the cell array region and the peripheral circuit region, the first film constituting the first mask layer for forming the first mask patterns in the cell array region and constituting a conductive layer for gates in the peripheral circuit region;
   forming the second mask patterns on the first film in the cell array region;
   forming the first mask patterns by patterning the first film using the second mask patterns as an etch mask in the cell array region; and
   forming a peripheral circuit gate including the first film in the peripheral circuit region.

18. The method of claim 17, wherein the first film is a polysilicon film.

19. The method of claim 17, before the forming of the first film in the cell array region and the peripheral circuit region, further comprising forming an insulating film on the surface of the semiconductor substrate in the peripheral circuit region.

20. A method of manufacturing a semiconductor device comprising:
   forming a stacked structure of sequentially stacked first mask patterns and second mask patterns with equal widths to expose active regions and isolation regions of a semiconductor substrate;
   forming reduced first mask patterns by decreasing the width of only the first mask patterns;
   forming trenches in the active regions and the isolation regions by etching the exposed portions of the semiconductor substrate using the second mask patterns as an etch mask;
   forming gate insulating films on inner walls of the trenches in the active regions; and
   depositing a conductive material on the semiconductor substrate covering the first and second mask patterns and filling the trenches in the active regions and the isolation regions, wherein the trenches are formed after the width of the first mask patterns have been reduced.

* * * * *